US011705388B2

(12) United States Patent
Somma et al.

(10) Patent No.: US 11,705,388 B2
(45) Date of Patent: Jul. 18, 2023

(54) ASSORTMENT OF SUBSTRATES FOR SEMICONDUCTOR CIRCUITS, CORRESPONDING ASSORTMENT OF DEVICES AND METHOD

(71) Applicant: STMicroelectronics S.r.l., Agrate Brianza (IT)

(72) Inventors: Cristina Somma, Milan (IT); Giovanni Graziosi, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 104 days.

(21) Appl. No.: 17/108,694

(22) Filed: Dec. 1, 2020

(65) Prior Publication Data

US 2021/0167029 A1 Jun. 3, 2021

(30) Foreign Application Priority Data

Dec. 2, 2019 (IT) ........................ 102019000022665

(51) Int. Cl.
*H01L 23/498* (2006.01)
*H01L 23/13* (2006.01)
*H01L 23/14* (2006.01)
*H01L 27/02* (2006.01)
*H01L 23/538* (2006.01)
*H01L 23/50* (2006.01)

(52) U.S. Cl.
CPC ........ *H01L 23/49816* (2013.01); *H01L 23/13* (2013.01); *H01L 23/14* (2013.01); *H01L 23/50* (2013.01); *H01L 23/5386* (2013.01); *H01L 27/0207* (2013.01); *H01L 2924/15321* (2013.01)

(58) Field of Classification Search
CPC ... H01L 23/49816; H01L 23/13; H01L 23/14; H01L 27/0207; H01L 2924/15321; H01L 23/50; H01L 23/5386
See application file for complete search history.

(56) References Cited

U.S. PATENT DOCUMENTS 8,786,069 B1 7/2014 Haba et al.
2004/0245617 A1 12/2004 Damberg et al.
(Continued)

FOREIGN PATENT DOCUMENTS

WO 2013137895 A1 9/2013

OTHER PUBLICATIONS

IT Search Report and Written Opinion for IT Appl. No. 102019000022665 dated Aug. 17, 2020 (8 pages).

*Primary Examiner* — Ahmed N Sefer
(74) *Attorney, Agent, or Firm* — Crowe & Dunlevy

(57) ABSTRACT

A first device includes a rectangular substrate having a first width and a first length and a first pattern of electrical interface nodes at first, second and third sides with a first set of electrical interface nodes at the fourth side. A second device includes a second rectangular substrate having a second width equal to the first width, a second length and a median line extending in the direction of the second width. A second pattern of electrical interface nodes for the second device includes two unmorphed replicas of the first pattern arranged mutually rotated 180° on opposite sides of the median line as well as two second sets of electrical interface nodes formed by two smaller morphed replicas of the first set of electrical interface nodes arranged mutually rotated 180° on opposite sides of said median line.

13 Claims, 6 Drawing Sheets

(56) References Cited

U.S. PATENT DOCUMENTS

| | | | |
|---|---|---|---|
| 2007/0057384 A1 | 3/2007 | Alam et al. | |
| 2010/0242011 A1* | 9/2010 | Mukai | G03F 1/36 |
| | | | 716/50 |
| 2014/0042643 A1* | 2/2014 | Yu | H01L 25/0655 |
| | | | 257/E23.174 |
| 2014/0231982 A1* | 8/2014 | Ogawa | H01L 23/50 |
| | | | 438/122 |
| 2014/0374900 A1* | 12/2014 | Kwon | H01L 23/36 |
| | | | 257/737 |
| 2018/0026019 A1* | 1/2018 | Tao | H01L 23/3157 |
| | | | 257/668 |
| 2021/0392740 A1* | 12/2021 | Hirano | H05K 1/0228 |

* cited by examiner

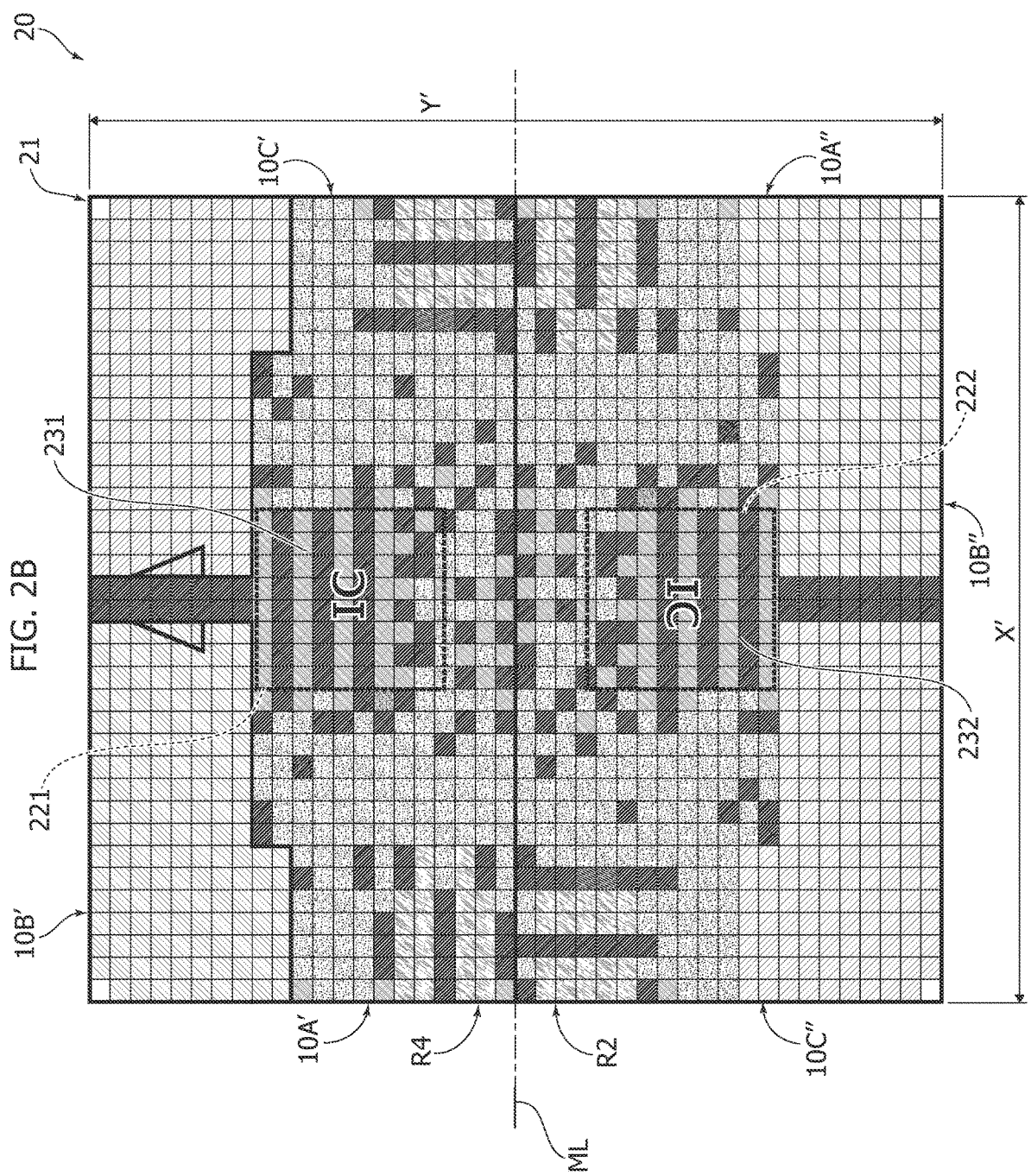

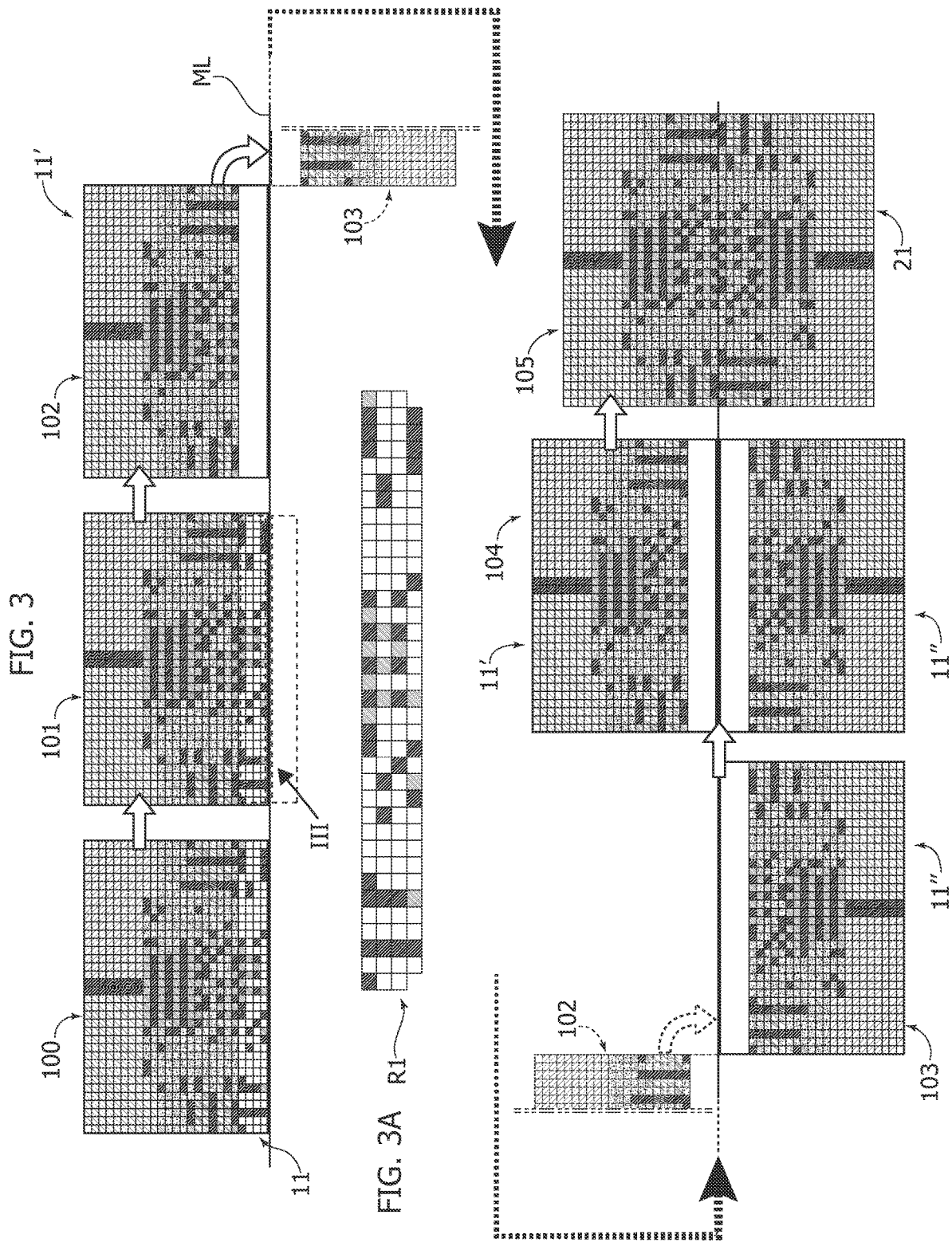

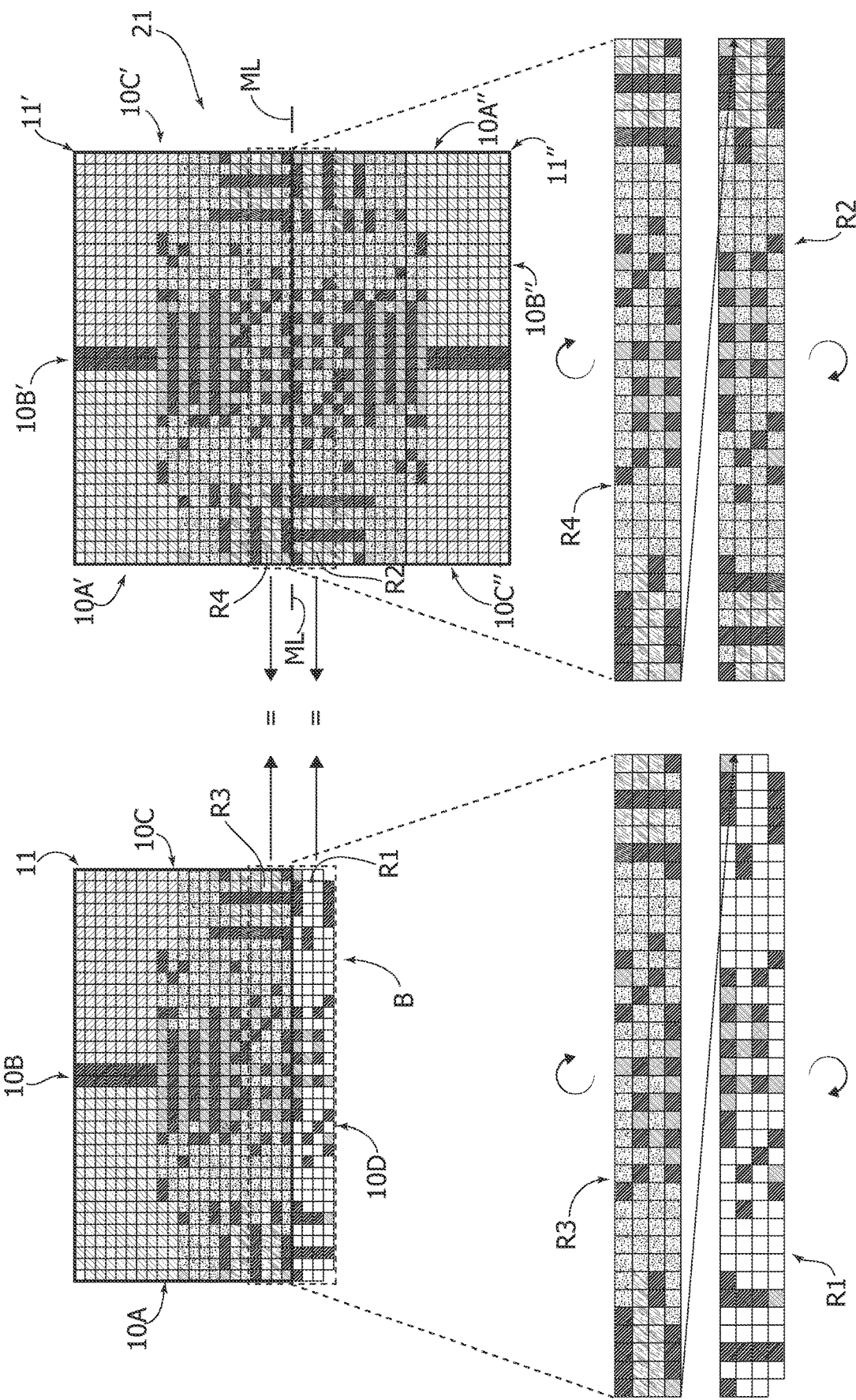

ASSORTMENT OF SUBSTRATES FOR SEMICONDUCTOR CIRCUITS, CORRESPONDING ASSORTMENT OF DEVICES AND METHOD

PRIORITY CLAIM

This application claims the priority benefit of Italian Application for Patent No. 102019000022665, filed on Dec. 2, 2019, the content of which is hereby incorporated by reference in its entirety to the maximum extent allowable by law.

TECHNICAL FIELD

The description relates to semiconductor circuits.

One or more embodiments may be applied to and/or be compatible with various technologies used in manufacturing semiconductor circuits.

Ball Grid Array (BGA), Flip Circuit (FP) and Wire Bond (WB) as well as System in Package (SiP) may be exemplary of such technologies.

BACKGROUND

The increase of design complexity together with the continuous growth of desired application performance and the interest for multiple/duplicated high-speed interface integration on packages with shorter cycle time represent a continued challenge in various sectors such as, for instance, high-end digital automotive products.

Common multiple high-speed interface and active device integration may result in increased package sizes and different package design developments for different application options (mid/low-end versus high-end).

This may undesirably result in complex and long validation flows.

Large active devices and packages which integrate multiple interfaces may involve a same interface replicated several times and/or multiple packages integrated on a complex substrate such as a printed circuit board (PCB). Plural (for instance, two) low-end packages coupled to provide a single high-end performance solution may be exemplary of such an approach.

The ability of providing a same level of performance for both low-end and high-end products with a package size for high-end products which is smaller than a multiple of (for instance twice) a corresponding low-end package size represents a desirable goal to pursue.

There is accordingly a need in the art to contribute in pursuing such a goal.

SUMMARY

One or more embodiments may relate to an assortment of substrates for semiconductor circuits.

One or more embodiments may relate to a corresponding assortment of devices.

One or more embodiments may relate to a corresponding design method.

As used herein, the term "assortment" is used in its conventional meaning (see, for instance, Cambridge Dictionary (English)) to designate a group of different types of something (for instance, mid/low-end performance substrates/devices and high-end performance substrates/devices).

Similarly, the term "morph/morphing" is used in its conventional meaning (see, for instance, Cambridge Dictionary (English)) to designate the act of (gradually) changing one image or pattern into another, or combining (merging) them, using a computer program, for instance.

One or more embodiments may provide a single high-end connectivity substrate/device providing twice the connectivity of a mid/low-end substrate/device with a high-end package size which is less than twice the package size of the mid/low-end arrangement.

One or more embodiments may provide a design modularity solution for parallel design architecture definition and layout implementation with the capability of deriving high-end package from the design of a (corresponding) mid/low-end package.

One or more embodiments may facilitate integration of multiple device instances (in an assortment) possibly including high-speed interfaces and passive components on conventional substrates and packages (for instance Ball Grid Array or BGA packages) with reduced package and substrate (PCB, for instance) size with the possibility of applying existing tools while also simplifying a design and validation flows.

One or more embodiments may facilitate achieving (full) layout compatibility.

One or more embodiments may involve a sequence including identifying a module, deriving a related connectivity with pre-intermediate and post-layout design integrity checks which facilitates achieving uniform performance, design flow simplification and improved validation flow with improved (optimized) cycle time.

One or more embodiments may retain compatibility with package mechanical form factors and facilitate replicating interface specifications as well as desired device positions on packages, metal lid design rules and sizing/positioning associated passive components.

For instance, one or more embodiments may be applied to System in Package (SiP) configurations with a metal lid and including one semiconductor chip or die with 50 surface mount device (SMD) decoupling capacitors for a mid-performance substrate/device and two corresponding semiconductor chips or dice with 100 SMD decoupling capacitors for a high-performance substrate/device.

One or more embodiments may rely on BGA technology involving 0.65 mm ball pitch with 8-layer HDI thin core with an 896 ball array (with a 24×17 mm substrate) for a mid-performance substrate/device and a 1508 ball array (with a 24×28 mm substrate) for a high-performance/device.

Of course, these quantitative figures are merely for exemplary purposes and are not to be constructed, even indirectly, in a limiting sense of the embodiments.

BRIEF DESCRIPTION OF THE DRAWINGS

One of more embodiments will now be described, by way of example only, with reference to the annexed figures, wherein:

FIGS. 2A and 2B are exemplary of design approaches;

FIG. 3 is exemplary of steps or actions taken in a design method, with FIG. 3A being a view on an enlarged scale of the portion of FIG. 3 indicated by arrow III;

FIG. 7 is a schematic representation of certain principles which may underlie one or more embodiments.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular conformations, structures, or characteristics may be combined in any adequate way in one or more embodiments. The references used herein are provided merely for convenience and hence do not define the extent of protection or the scope of the embodiments.

It will be appreciated that, for the sake of simplicity and ease of explanation, the various figures may not be drawn to a same scale.

Figure 1B:
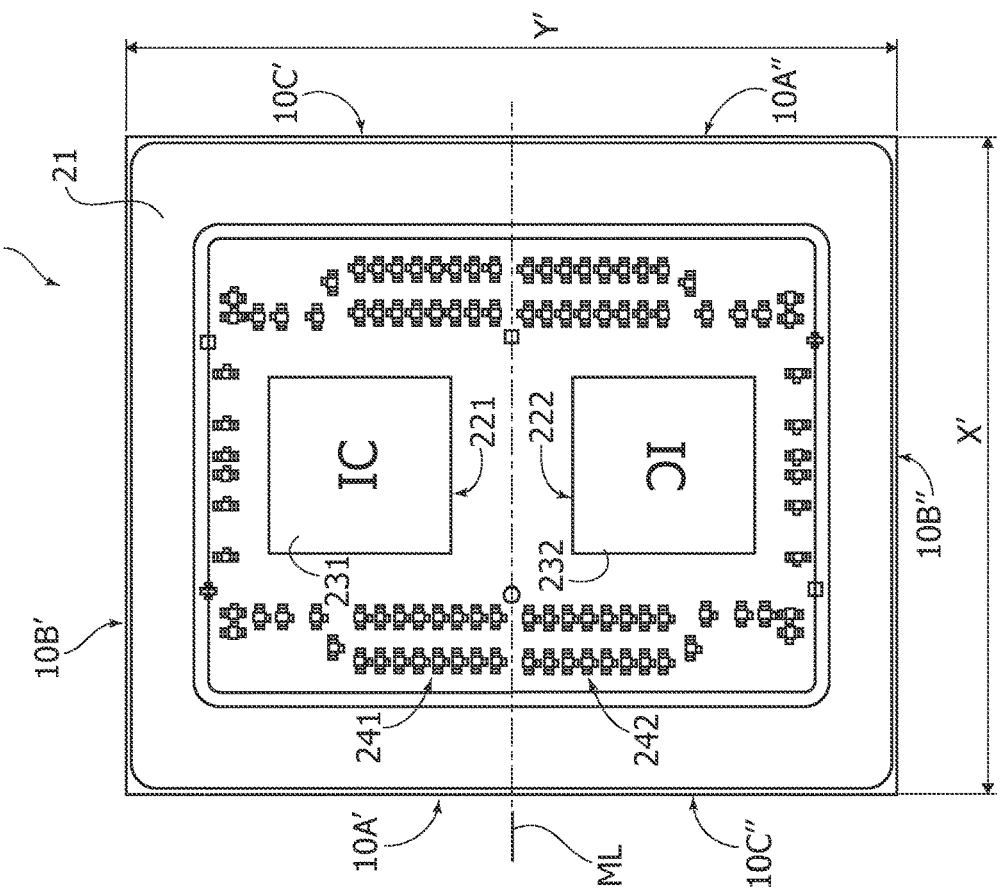
FIGS. 1A and 1B are views of substrates/devices.
Figure 1A:
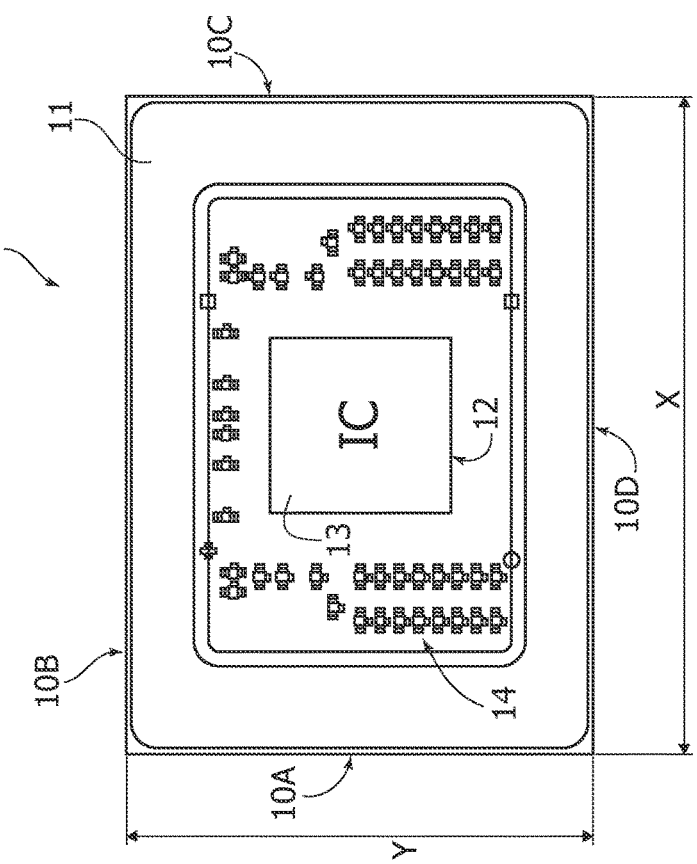

FIGS. 1A and 1B are exemplary of two (semiconductor) devices—of the system in package or SiP type, for instance—included in an assortment comprising both mid/low-performance elements (as exemplified at 10 in FIG. 1A) and high-performance elements (as exemplified at 20 in FIG. 1B).

Both devices (or "packages") 10 and 20 in FIGS. 1A and 1B share a common general structure including a substrate 11 (FIG. 1A) or 21 (FIG. 1B) such as a printed circuit board or PCB having one or more mounting locations 12 (FIG. 1A) and 221, 222 (FIG. 1B) for mounting corresponding semiconductor circuits 13 (FIG. 1A) and 231, 232 (FIG. 1B) thereon.

Integrated circuits (ICs) may be exemplary of such semiconductor circuits.

As exemplified in FIGS. 1A and 1B the devices 10 and 20 may also comprise various associated (passive, for instance) components 14 (FIG. 1A) and 241, 242 (FIG. 1B) arranged on the substrates 11, 21.

Throughout this exemplary description it will be assumed for the sake of simplicity that the semiconductor circuits 13 and 231, 232 (these two being arranged mutually rotated 180° as discussed in the following) are essentially identical circuits.

Those of skill in the art will otherwise appreciate that this does not represent per se a mandatory feature of embodiments. As discussed in the following, one or more embodiments may be related primarily to the arrangement of electrically-conductive formations (for instance balls in a ball grid array or BGA) providing electrical interface nodes for the semiconductor circuit mounting locations 12 and 221, 222.

As exemplified in FIG. 1A, the first substrate 11 comprises a rectangular-shaped substrate having a width X and a length Y with a semiconductor circuit mounting location 12 (and the circuit 13) arranged centrally of the rectangular-shaped substrate.

To that effect, the location 12 and the circuit 13 can be either centered at the crossing point of the diagonals of the rectangular-shaped substrate (as exemplified herein) or arranged with a certain offset with respect to that crossing point, with such an offset intended to be symmetrically reflected on the substrate 21 (180° rotation) as discussed in the following.

However implemented, such a central arrangement can keep the location 12 and the circuit 13 at a distance from the outer rim of the substrate 11 and facilitate reducing risks linked to mechanical stress related to the rectangular form factor of the substrate 11.

It will be otherwise appreciated that referring to a rectangular shape for the substrate 12 also includes a possible square shape as a "degenerate" rectangular form.

As exemplified in FIG. 1B, the (high-performance) substrate 21 also comprises a rectangular-shaped substrate having a width X' equal to the width X of the substrate 11 and a length Y' which, according to one or more embodiments, may be less than twice the length Y of the substrate 11.

Those of skill in the art will easily appreciate that referring to X, X' as "width" and to Y, Y' as "length" is merely intended to distinguish between the two dimensions of the substrates 11 and 21 and does not imply any specific meaning and/or relationships between the two.

For instance, in the exemplary substrates presented herein:

in substrate 11, the width X is longer than the length Y,
in substrate 21, the width X' is shorter than the length Y'.

Referring to the dimensions X, X' as "width" and to the dimensions Y, Y' as "length" is thus merely for ease and simplicity of understanding: these designations are thus suited to be exchanged, with the dimensions X, X' possibly referred to as "length" and the dimensions Y, Y' as "width", respectively.

That is, while the instant detailed description of exemplary embodiments will refer throughout to a "length" Y' less than twice the "length" Y with the "width" X' equal to the "width" X, one or more embodiments may likewise aim at having a "length" X' less than twice the "length" X with a "width" Y' equal to the "width" Y.

Merely by way of example (and with no limiting intent of the embodiments) the substrate 11 may have a dimension X equal to 24 mm and a dimension Y equal to 17 mm while the substrate 21 may have a dimension X' equal to a dimension X, and thus again equal to 24 mm, and a dimension Y' equal to 28 mm (which is less than twice the dimension X, namely 2×17 mm=34 mm).

In one of more embodiments, having a same value X=X' for both substrates 11 and 21 (and thus for both devices or packages 10 and 20) facilitates having a same arrangement of electrically-conductive formations (for instance a same matrix of rows and columns of balls in a BGA array in a same area) while also facilitating a replication of a layout in the X, X' direction.

To that effect, the substrate 21 as exemplified in FIG. 1B exhibits a median line ML extending in the direction of the width X' of the substrate 21—that is, horizontally with reference to FIGS. 1B and 2B—thus notionally cutting the substrate 21 symmetrically into two portions, namely two portions which—as discussed in the following—may be regarded as mutually rotated 180° with respect to each other.

It will be recalled that a geometric shape or object is symmetric if it can be divided into two or more identical pieces that are arranged in an organized fashion: that is, an object is symmetric if there is a transformation that moves individual pieces of the object.

Consequently, the terms symmetry/symmetrical as possibly used herein are not to be construed, even indirectly, as implying by way of necessity a reflectional symmetry (line or mirror symmetry) which applies to the specific case of symmetry where a line going through an object divides it into two pieces which are mirror images of each other. Indeed, the two portions of the substrate 21/device 20 defined by the median line ML will not expectedly be mirror or reflectionally symmetrical to each other insofar as those two parts or portions can be regarded as mutually rotated 180° to each other.

For instance, as already discussed, the location 12 and the circuit 13 in the substrate 11 can be arranged with a certain offset with respect to the crossing point of the diagonals of the rectangular shape of the substrate 11 and such an offset can be reflected on the substrate 21 (180° rotation) in a symmetrical (yet not mirror or reflectionally symmetrical) arrangement.

As exemplified in FIG. 1A, the substrate 11 has first, second and the third sides 10A, 10B, 10C of its rectangular-shaped substrate and a fourth side 10D.

As exemplified herein, the sides 10A, 10C provide a first pair of opposed (short) sides of the rectangular-shaped substrate while the sides 10B and 10D provide a second pair of opposed (long) sides of the rectangular-shaped substrate.

Figure 2A:
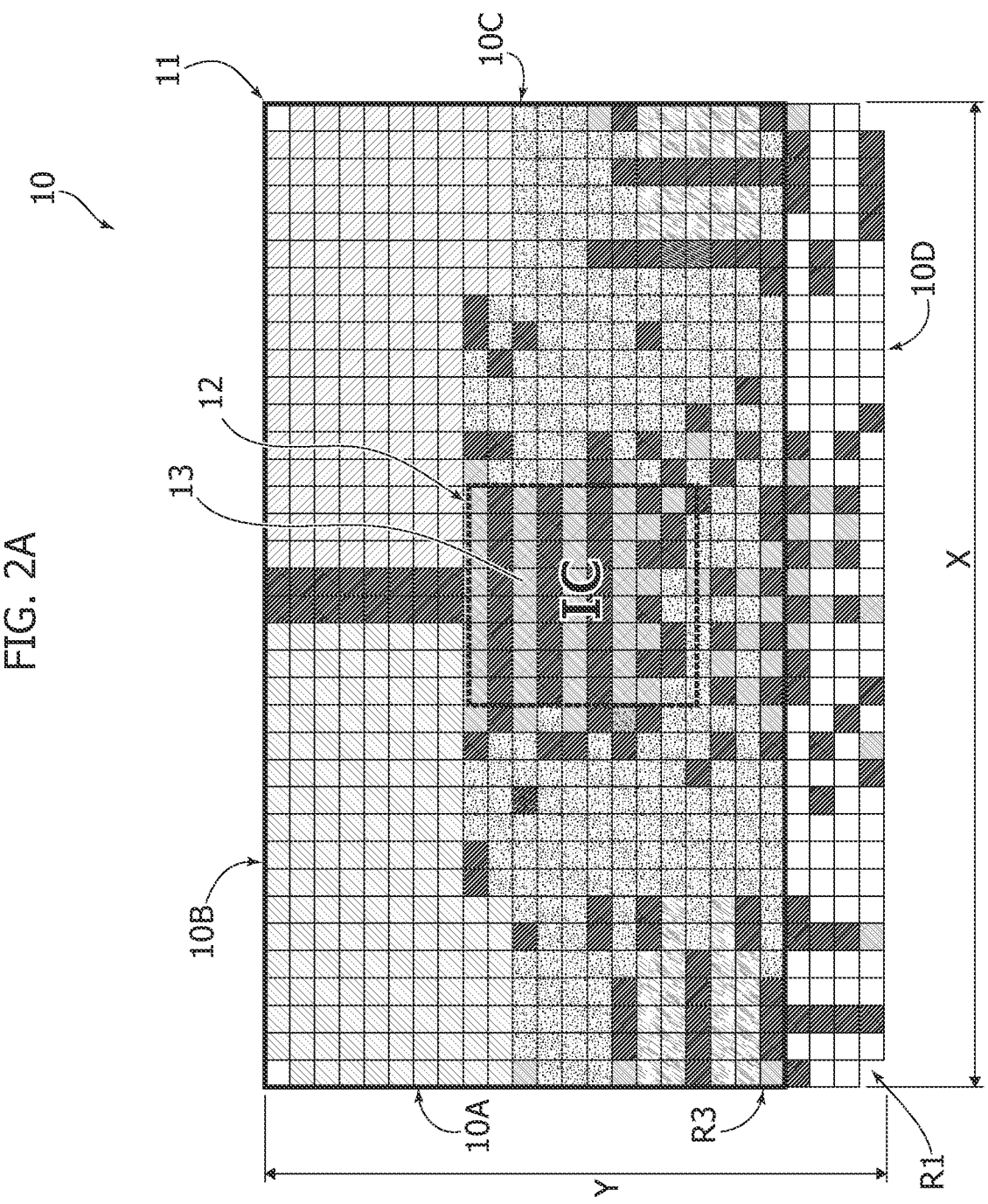

FIG. 2A represents with different shadings different types of electrically-conductive formations (balls in a ball grid array, for instance) which may provide electrical interface nodes for a semiconductor circuit mounting location such as 12 in FIG. 1A.

As known to those of skill in the art, such interface nodes may fulfill different purposes such as memory (double data rate or DDR SDRAM, for instance), processor (mobile industry processor interface or MIPI, for instance), peripheral (peripheral component interconnect express or PCIe, for instance), and/or generic input output interface functions including power and ground (P/G) nodes.

With the exception of what will be discussed more in detail in the following (for power and ground nodes, for instance), the specific nature and role of such nodes per se is of no specific importance for the embodiments.

Also, locations (small squares) left blank in the representation of FIG. 2A are exemplary of node locations which may be non-assigned ("empty") nodes/locations.

As discussed in the following, one or more embodiments may take advantage of the possibility of locating at one of the four sides of the rectangular shape of the substrate (side 10D is taken as an example herein) primarily if not exclusively power and ground nodes (BGA balls, for instance), possibly in a rather sparse arrangement having a certain amount of non-assigned node locations therebetween.

Such an arrangement of nodes is compatible with the central location of the mounting area 12 for the semiconductor circuit 13 which, as discussed, is primarily related to the desire of achieving an optimized rectangular form factor ratio as well as with having a metal lid and the assembly of passive components such as 14 in FIG. 1A.

Briefly, the device 10/substrate 11 as exemplified in FIG. 1A can be regarded as comprising (first) rectangular-shaped substrate having a first width X and a first length Y as well as a semiconductor circuit mounting location 12 arranged centrally of the substrate with electrically-conductive formations providing (see for instance FIG. 2A):

a (first) pattern of electrical interface nodes at the first, second and third sides 10A, 10B, 10C of the rectangular-shaped substrate another pattern of electrical interface nodes extending along the fourth side 10D of the rectangular-shaped substrate.

In the following this further pattern of electrical interface nodes at side 10D will be referred to as a first set in order to avoid confusion with the pattern at the first, second and third sides 10A, 10B, 10C. This distinction between "pattern" and "set" of nodes is thus merely for simplicity and clarity of description and does not imply by way of necessity any substantial differences in the nodes considered.

One or more embodiments may be based on the recognition that a (high-end) device 20/substrate 21 as exemplified in FIGS. 1B and 2B can be generated (designed for instance) starting from the (mid-end) device 10/substrate 11 of exemplified in FIGS. 1A and 2A without by necessity duplicating such a starting structure of FIGS. 1A and 2A provided that the portion of the substrate 11 at the side 10D is somehow "shrunk" (virtually removed).

In that way, a resulting structure obtainable by coupling two such starting structures at the median line ML mutually rotated 180° may exhibit a resulting length Y' which is less than twice the length Y (as mentioned before by way of example, this may be 28 mm instead of 17×2=34 mm).

In one or more embodiments such a result may be obtained by letting the device 20/substrate 21 have a pair of semiconductor circuit locations 221, 222 arranged symmetrically with respect to the median line ML with the electrically-conductive formations (balls in a ball grid array, for instance) arranged in a respective (second) pattern of electrically interface nodes, with such a second pattern of electrically interface nodes comprising:

two unmorphed replicas of the (first) pattern of electrically interface nodes at the sides 10A, 10B and 10C of the device 10/substrate 11 of FIGS. 1A and 2A arranged (around the semiconductor circuit locations 221, 222) on opposite sides of the median line ML mutually rotated 180°;

two second sets of electrically interface nodes where these second sets are smaller morphed replicas (for instance compacted or shrunk to be made narrower) of the set of electrical interface nodes at the side 10D of the device 10/substrate 11 of FIGS. 1A and 2A, with these second sets of electrically interface nodes arranged again mutually rotated 180° between the mounting locations 221, 222.

In that way, the second length Y' of the device 20/substrate 21 may be rendered less than twice the length Y of the device 10/substrate 11.

One or more embodiments may thus provide, in the high-end package (device 20/substrate 21), same relative positions—and thus same electrical coupling arrangements—of the semiconductor circuits 231, 232 with respect to the layout and ball map, thus facilitating having a same layout matching, "from bump to ball", for instance.

In one or more embodiments, the mutual 180° rotation may extend to the two semiconductor circuits 231, 232 (this is exemplified in FIGS. 1B and 2B by the lettering IC being reproduced "upside down" in the circuit 232), which facilitates having a same PCB routing escape from both substrates 11 and 21.

The 180° mutual rotation is exemplified in FIGS. 1B and 2B by the lettering 10A', 10B', 10C' and 10A", 10B", 10C" pointing to the two unmorphed replicas of the (first) pattern of electrically interface nodes at the sides 10A, 10B and 10C of the device 10/substrate 11 of FIGS. 1A and 2A.

As discussed previously, referring to those replicas as "unmorphed" denotes such replicas as obtained without changing one pattern into another.

Conversely, referring to the two second sets of electrically interface nodes arranged between the mounting locations 221, 222 as smaller (narrower, for instance) morphed replicas of the set of electrical interface nodes at the side 10D of the device 10/substrate 11 of FIGS. 1A and 2A denotes such replicas as possibly obtained by acts of combining (or merging), as discussed in the following, possibly using a computer program, to make them smaller, for instance narrower across their length along the mounting locations 221, 222.

One or more embodiments were found to facilitate maintaining identical values for a metal lid footprint width and cavity height on both types of packages (10 in FIGS. 1A, 2A and 20 in FIGS. 1B, 2B, respectively) which facilitates applying the same assembly rules for both packages with only cavity dimensions different to host two circuits 231, 232 in FIGS. 1B, 2B in the place of a single circuit 13 in FIGS. 1A, 2A.

Ancillary components (passive components, for instance) 14 and 241, 242 can be located taking into account rules and specifications for both versions, for instance in terms of lid footprints and distances (component-to-circuit edges and component-to-component).

One or more embodiments thus facilitate designing a single layout and achieving different products with a second product (FIGS. 1B and 2B) being twice a first one (FIG. 1A and 2A) in an assortment in terms of functionality and performance without correspondingly increasing the product size: as noted, a substrate 21 as exemplified in FIGS. 1B and 2B can have a length Y' which is less than twice the length Y of the substrate 11 exemplified in FIGS. 1A and 2A.

FIG. 3 is exemplary of steps or actions which may lead from a package 10 as exemplified in FIGS. 1A, 2A to a package 20 as exemplified in FIGS. 1B, 2B.

In FIG. 3, reference 100 denotes a step or action of designing a substrate 11 as exemplified in FIGS. 1A and 2A, namely (for instance) a mid-end ball out including 896 balls with 24×17 mm substrate 11. Once again it is noted that these quantitative figures are merely for exemplary purposes and are not intended to limit the embodiments.

The step or action denoted 101 in FIG. 3 is exemplary of a possible "ball-out" action at the side 10D (the designations of the various sides 10A to 10D are not reproduced in FIG. 3 for simplicity of illustration). That step or action may correspond to locating at the fourth side 10D of the substrate 11 a region R1 of electrical interface nodes (balls) as exemplified in FIG. 3A, namely (for instance) 4 (four) rows of balls, which can be "removed" from the layout for the substrate 11 to produce, as exemplified at 102 a modified version of the substrate 11 (designated 11') where those rows or balls are no longer provided as previously provided in the substrate 11.

Figure 4B:
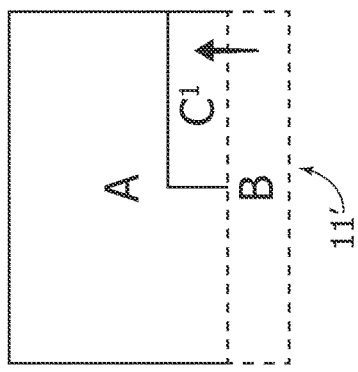
FIGS. 4A, 4B, 5 and 6 are further exemplary of possible steps or actions.
Figure 4A:
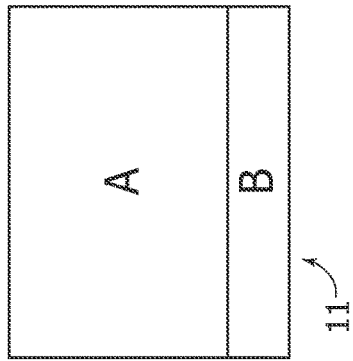
Figure 5:
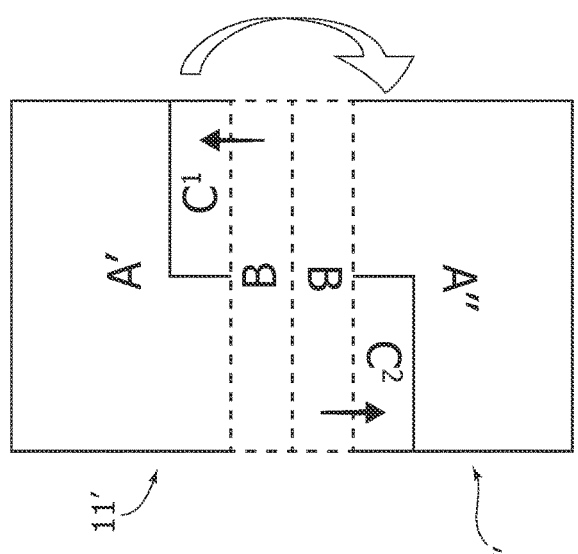

As schematically represented in the sequence of FIGS. 4A, 4B (and as further discussed in the following) these interface nodes (balls, for instance) designated B in FIGS. 4A, 4B and 5 are not dispensed with (which might entail a negative effect on device performance) but are, instead, rather "moved"—as denoted by $C^1$ in FIG. 4B—to other regions in the rest of the substrate, designated A, for instance with the substrate 11 already configure to have a portion A as exemplified in FIG. 4A equal to A+$C^1$ as exemplified in FIG. 4B.

Reference 103 in FIG. 3 is exemplary of a step or action for generating a version 11" of 11' which is rotated 180° (that is, turned upside down) with respect to 11'.

Reference 104 in FIG. 3 is exemplary of a step or action where the two versions 11' and 11" mutually rotated 180° being arranged in a face-to-face relationship to be then adjoined as exemplified at 105 in FIG. 3 to generate the resulting substrate 21.

Figure 6:
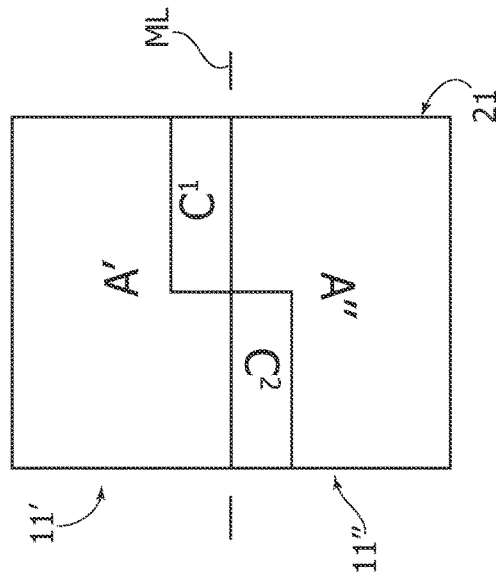

The sequence of steps or actions 102 to 105 in FIG. 3 is further explained in a schematic way in FIGS. 5 and 6 where the substrate 21 in FIG. 6 is shown as resulting from adjoining the two versions 11' and 11" where the "removed" region B (namely R1 in FIG. 3A) has been moved to regions $C^1$ and $C^2$ of the remaining parts A' and A" of the ball layout.

It will be otherwise appreciated that, while exemplified for simplicity as physical steps of removing/displacing certain electrical interface nodes (ball-out) to generate the version 11', rotate it 180° to produce the version 11" and then arranging 11' and 11" in a face-to-face relationship to be finally adjoined at the median line ML, the steps or actions exemplified in FIG. 3 and FIGS. 4A, 4B, 5 and 6 are expected to be implemented as design steps or actions of the package 20 starting from the package 10 and not as physical actions proper.

One or more embodiments may take advantage of the option of arranging at the side 10D of the basic substrate 11 power and/or ground interface nodes (balls).

This may facilitate having at side 10D a certain amount of non-assigned locations, that is empty spaces therebetween, as may be perceived in FIG. 3A and/or a certain node redundancy: power and/or ground interface nodes (balls) may lend themselves to be shared by different circuit portions, which may not be the case with "signal" nodes expected to convey different signals towards and away from different circuit portions (memory, processor, peripherals, and so on).

For instance (as exemplified more in detail in FIG. 7) this may involve having a power/ground (P/G) node assignment in the portion R1 identical to the portion R3 (rotated by) 180° and shared with different circuit portions, while non-assigned nodes in the portion R1 may serve the purpose of hosting mid-package on high-package PCB layout (substrate 11 versus substrate 21) without introducing any short circuit or wrong connections.

These factors may facilitate moving the region R1 of nodes to a neighboring substrate (PCB, for instance) region as exemplified in FIGS. 5 and 6 where B is shown moved to $C^1$ and $C^2$ for example by "pushing" B to $C^1$ and $C^2$. This also facilitates a uniform distribution in $C^1$ and $C^2$ so that, for instance, a same core power/ground electrical interface node (ball) assignment can be used for both.

Such a process is further exemplified in FIG. 7 where the rows of balls designated B in Figures such as FIGS. 4A, 4B and 5 are shown as representing at the side 10D of the substrate 11 a "distal" (outer) subset or region R1 of interface nodes (e.g. balls) adjacent a "proximal" subset or region designated R3.

As exemplified in the bottom part of FIG. 7, two such subsets or regions R1 and R3 can be morphed by merging into a respective one of two (narrower) corresponding regions R2 and R4 of 11' and 11" bordering—mutually rotated 180°—at the median line ML, with such morphing facilitated by:

configuring the portion R3 to comprise signal (SIG) and power/ground (P/G) nodes with the portion R1 identical to the portion R3 rotated by 180° with SIG nodes converted to non-assigned locations and sharing the same power/ground (P/G) nodes so that R4=R3 (with identical SIG and identical P/G node assignments);

configuring R2 to be identical to R1 by converting empty spaces of R1 to SIG nodes of R4 rotated by 180° and sharing the same P/G nodes.

A same power/ground node arrangement will be shared in R1 and R3 with each one of R2 and R4 so that, for instance, an identical core power/ground ball assignment in the substrate 11 of FIGS. 1A and 2A can be re-used in the regions R2 or R4 of the substrate 21, that is the core power/ground node assignment on R3 and R4 will be the same of R1 and R2, but rotated 180°.

The foregoing will facilitate having a same node assignment in the regions R2 and R4, just mutually rotated 180° as can be appreciated on the right-hand side of the bottom part of FIG. 7.

As exemplified herein, an assortment of substrates (for instance, 11, 21) for semiconductor circuits (for instance, 13, 231, 232) may comprise at least one first substrate (for instance, 11) and at least one second substrate (for instance, 21), the first substrate and the second substrate in the assortment having at least one semiconductor circuit mounting location (for instance, 12; 221, 222) with an array of electrically-conductive formations providing electrical interface nodes for said at least one semiconductor circuit mounting location, wherein:

the at least one first substrate may comprise a first rectangular-shaped substrate having a first width (for instance, X) and a first length (for instance, Y) as well as a semiconductor circuit mounting location (for instance, 12) centrally thereof with electrically-conductive formations providing a first pattern of electrical interface nodes at first (for instance, 10A), second (for instance, 10B) and third (for instance, 10C) sides of said first rectangular-shaped substrate and a first set (for instance, R1, R3) of electrical interface nodes at a fourth side (for instance, 10D) of said first rectangular-shaped substrate; and the at least one second substrate (for instance, 21) may comprise a second rectangular-shaped substrate having a second width (for instance, X') equal to said first width (for instance, X), a second length (for instance, Y') and a median line (for instance, ML) extending in the direction of said second width as well as a pair of semiconductor circuit mounting locations (for instance, 221, 222) on opposite sides of said median line with electrically-conductive formations providing a second pattern of electrical interface nodes, wherein said second pattern of electrical interface nodes comprises two unmorphed replicas of said first pattern of electrical interface nodes arranged mutually rotated 180° on opposite sides of said median line plus two second sets (for instance, R2, R4) of electrical interface nodes located between the semiconductor circuit mounting locations in said pair of semiconductor circuit mounting locations, wherein said second sets of electrical interface nodes comprise smaller morphed replicas of said first set of electrical interface nodes arranged mutually rotated 180° on opposite sides of said median line, wherein said second length (for instance, Y') is less than twice said first length (for instance, Y).

It is again recalled that, throughout this description, referring to the dimensions X, X' as "width" and to the dimensions Y, Y' as "length" is merely for ease and simplicity of understanding: these designations are thus suited to be exchanged, with the dimensions X, X' possibly referred to as "length" and the dimensions Y, Y' as "width", respectively.

In an assortment as exemplified herein, said first set of electrical interface nodes at said fourth side of said first rectangular-shaped substrate may comprise a proximal region (for instance, R3) and a distal region (for instance, R1) of electrical interface nodes and said smaller morphed replicas comprise a merge of said proximal region and said distal region of electrical interface nodes.

In an assortment as exemplified herein, said proximal and distal regions of electrical interface nodes may include empty spaces between said electrical interface nodes and said merge of said proximal region and said distal region of electrical interface nodes may comprise electrical interface nodes of one of said distal and proximal regions at empty spaces of one the other said distal and proximal regions.

In an assortment as exemplified herein, said proximal and distal regions of electrical interface nodes may include an arrangement of power/ground electrical interface nodes and said merge of said proximal region may have a same arrangement of power/ground electrical interface nodes.

In an assortment as exemplified herein, said array of electrically-conductive formations may comprise a ball grid array.

An assortment of semiconductor devices as exemplified herein may comprise:

at least one first semiconductor device comprising a first semiconductor circuit mounted at a semiconductor circuit mounting location in a first substrate in an assortment of semiconductor circuit mounting substrates as exemplified herein; and at least one second semiconductor device comprising a pair of second semiconductor circuits mounted at a pair of semiconductor circuit mounting locations in a second substrate in an assortment of semiconductor circuit mounting substrates as exemplified herein.

In an assortment of semiconductor devices as exemplified herein, said pair of semiconductor circuits (for instance, 231, 232) mounted at said pair of semiconductor circuit mounting locations in said at least one second semiconductor device may comprise two semiconductor circuits arranged mutually rotated 180° on opposite sides of said median line.

In an assortment of semiconductor devices as exemplified herein, said pair of semiconductor circuits (for instance, 231, 232) mounted at said pair of semiconductor circuit mounting locations in said at least one second semiconductor device may comprise two identical semiconductor circuits arranged mutually rotated 180° on opposite sides of said median line (ML).

In an assortment of semiconductor devices as exemplified herein, said pair of semiconductor circuits (for instance, 231, 232) mounted at said pair of semiconductor circuit mounting locations in said at least one second semiconductor device may comprise two semiconductor circuits identical to said first semiconductor circuit (for instance, 13) mounted at said semiconductor circuit mounting location in said at least one first semiconductor device.

A method as exemplified herein for designing semiconductor devices comprising a substrate having at least one semiconductor circuit mounting location, wherein the substrate is provided with an array of electrically-conductive formations providing electrical interface nodes for said at least one semiconductor circuit mounting location, may comprise:

designing a first semiconductor device with a first substrate comprising a first rectangular-shaped substrate having a first width and a first length as well as a semiconductor circuit mounting location centrally thereof with electrically-conductive formations providing a first pattern of electrical interface nodes at first, second and third sides of said first rectangular-shaped substrate and a first set of electrical interface nodes at a fourth side of said first rectangular-shaped substrate;

designing a second semiconductor device with a second substrate comprising a second rectangular-shaped substrate having a second width equal to said first width, a second length and a median line extending in the direction of said second width as well as a pair of semiconductor circuit mounting locations on opposite sides of said median line with electrically-conductive formations providing a second pattern of electrical interface nodes;

designing said second pattern of electrical interface nodes to comprise:

two unmorphed replicas of said first pattern of electrical interface nodes arranged mutually rotated 180° on opposite sides of said median line; and two second sets of electrical interface nodes located between the semiconductor circuit mounting locations in said pair of semiconductor circuit mounting locations, the two second sets of electrical interface nodes comprising smaller morphed replicas of said first set of electrical interface nodes arranged mutually rotated 180° on opposite sides of said median line, wherein said second length is less than twice said first length.

A method as exemplified herein may comprise:

designing said first set of electrical interface nodes at said fourth side of said first rectangular-shaped substrate to comprise a proximal region and a distal region of electrical interface nodes; and providing said smaller morphed replicas by merging said proximal region and said distal region (R1) of electrical interface nodes.

Without prejudice to the underlying principles, the details and the embodiments may vary, even significantly, with respect to what has been described by way of example only without departing from the scope of the embodiments.

The claims are an integral part of the technical disclosure of the invention as provided herein.

The extent of protection is determined by the annexed claims.

The invention claimed is:

1. An assortment of substrates for semiconductor circuits, wherein the assortment comprises:

at least one first substrate and at least one second substrate, the first substrate and the second substrate in the assortment each having at least one semiconductor circuit mounting location with an array of electrically-conductive formations providing electrical interface nodes for said at least one semiconductor circuit mounting location;

wherein the at least one first substrate comprises a first rectangular-shaped substrate having a first width and a first length as well as a semiconductor circuit mounting location that is centrally positioned with electrically-conductive formations providing a first pattern of electrical interface nodes at first, second and third sides of said first rectangular-shaped substrate and a first set of electrical interface nodes at a fourth side of said first rectangular-shaped substrate; and wherein the at least one second substrate comprises a second rectangular-shaped substrate having a second width equal to said first width, a second length that is less than twice said first length and a median line extending in a direction of said second width as well as a pair of semiconductor circuit mounting locations on opposite sides of said median line with electrically-conductive formations providing a second pattern of electrical interface nodes, wherein said second pattern of electrical interface nodes comprises two unmorphed replicas of said first pattern of electrical interface nodes arranged mutually rotated 180° on opposite sides of said median line plus two second sets of electrical interface nodes located between the semiconductor circuit mounting locations in said pair of semiconductor circuit mounting locations, wherein said two second sets of electrical interface nodes comprise smaller morphed replicas of said first set of electrical interface nodes arranged mutually rotated 180° on opposite sides of said median line.

2. The assortment of claim 1, wherein said first set of electrical interface nodes at said fourth side of said first rectangular-shaped substrate comprises a proximal region of electrical interface nodes and a distal region of electrical interface nodes and said smaller morphed replicas comprise a merger of said proximal region of electrical interface nodes and said distal region of electrical interface nodes.

3. The assortment of claim 2, wherein each of said proximal region of electrical interface nodes and distal region of electrical interface nodes include empty spaces between said electrical interface nodes and wherein said merger of said proximal region of electrical interface nodes and said distal region of electrical interface nodes comprises electrical interface nodes of one of said distal and proximal regions at empty spaces of one the other said distal and proximal regions.

4. The assortment of claim 2, wherein each of said proximal region of electrical interface nodes and distal region of electrical interface nodes include an arrangement of power/ground electrical interface nodes and wherein said merger of said proximal region of electrical interface nodes has a same arrangement of power/ground electrical interface nodes.

5. The assortment of claim 1, wherein said array of electrically-conductive formations comprises a ball grid array.

6. An assortment of semiconductor devices, comprising:

at least one first semiconductor device comprising:

a first substrate having a first semiconductor circuit mounting location with an array of electrically-conductive formations providing electrical interface nodes for said first semiconductor circuit mounting location;

a first semiconductor circuit mounted at said first semiconductor circuit mounting location;

wherein the first substrate comprises a first rectangular-shaped substrate having a first width and a first length, wherein said first semiconductor circuit mounting location is centrally positioned with electrically-conductive formations providing a first pattern of electrical interface nodes at first, second and third sides of said first rectangular-shaped substrate and a first set of electrical interface nodes at a fourth side of said first rectangular-shaped substrate; and at least one second semiconductor device comprising:

a second substrate having second and third semiconductor circuit mounting locations with an array of electrically-conductive formations providing electrical interface nodes for said second and third semiconductor circuit mounting locations;

a second semiconductor circuit mounted at said second semiconductor circuit mounting location;

a third semiconductor circuit mounted at said third semiconductor circuit mounting location;

wherein the second substrate comprises a second rectangular-shaped substrate having a second width equal to said first width, a second length that is less than twice said first length and a median line extending in a direction of said second width with the second and third semiconductor circuit mounting locations on opposite sides of said median line with electrically-conductive formations providing a second pattern of electrical interface nodes, wherein said second pattern of electrical interface nodes comprises two unmorphed replicas of said first pattern of electrical interface nodes arranged mutually rotated 180° on opposite sides of said median line plus two second sets of electrical interface nodes located between the semiconductor circuit mounting locations in said pair of semiconductor circuit mounting locations, wherein said two second sets of electrical interface nodes comprise smaller morphed replicas of said first set of electrical interface nodes arranged mutually rotated 180° on opposite sides of said median line.

7. The assortment of semiconductor devices of claim 6, wherein said second and third semiconductor circuits mounted at said second and third semiconductor circuit mounting locations in said at least one second semiconductor device comprises two semiconductor circuits arranged mutually rotated 180° on opposite sides of said median line.

8. The assortment of semiconductor devices of claim 6, wherein said second and third semiconductor circuits mounted at said second and third semiconductor circuit mounting locations in said at least one second semiconductor device comprises two identical semiconductor circuits arranged mutually rotated 180° on opposite sides of said median line.

9. The assortment of semiconductor devices of claim 8, wherein said second and third semiconductor circuits mounted at said second and third semiconductor circuit mounting locations in said at least one second semiconductor device comprises two semiconductor circuits identical to said first semiconductor circuit mounted at said first semiconductor circuit mounting location in said at least one first semiconductor device.

10. A method of designing semiconductor devices which include a substrate having at least one semiconductor circuit mounting location, wherein the substrate is provided with an array of electrically-conductive formations providing electrical interface nodes for said at least one semiconductor circuit mounting location, wherein the method comprises:
designing a first semiconductor device with a first substrate comprising a first rectangular-shaped substrate having a first width and a first length as well as a first semiconductor circuit mounting location centrally thereof with electrically-conductive formations providing a first pattern of electrical interface nodes at first, second and third sides of said first rectangular-shaped substrate and a first set of electrical interface nodes at a fourth side of said first rectangular-shaped substrate; and
designing a second semiconductor device with a second substrate comprising a second rectangular-shaped substrate having a second width equal to said first width, a second length less than twice said first length and a median line extending in a direction of said second width as well as first and second semiconductor circuit mounting locations on opposite sides of said median line with electrically-conductive formations providing a second pattern of electrical interface nodes;

wherein designing said second semiconductor device comprises:
generating two unmorphed replicas of said first pattern of electrical interface nodes;
arranging the two unmorphed replicas in said second pattern of electrical interface nodes mutually rotated 180° on opposite sides of said median line;
morphing said first set of electrical interface nodes to generate two second sets of electrical interface nodes, wherein each second set is a smaller morphed replica of said first set of electrical interface nodes; and
arranging the two second sets of electrical interface nodes located between the first and second semiconductor circuit mounting locations in said second pattern of electrical interface nodes mutually rotated 180° on opposite sides of said median line.

11. The method of claim 10:
wherein designing the first semiconductor device comprises designing said first set of electrical interface nodes at said fourth side of said first rectangular-shaped substrate to comprise a proximal region of electrical interface nodes and a distal region of electrical interface nodes; and
wherein morphing said first set of electrical interface nodes to produce said smaller morphed replicas comprises merging said proximal region of electrical interface nodes and said distal region of electrical interface nodes.

12. A method, comprising:
designing a first semiconductor device to have a first substrate comprising a first rectangular-shape with a first width and a first length as well as a first semiconductor circuit mounting location with electrically-conductive formations providing a first pattern of electrical interface nodes at first, second and third sides of said first rectangular-shaped substrate and a first set of electrical interface nodes at a fourth side of said first rectangular-shaped substrate;
generating two unmorphed replicas of said first pattern of electrical interface nodes;
morphing said first set of electrical interface nodes to generate two second sets of electrical interface nodes, wherein each second set is a smaller morphed replica of said first set of electrical interface nodes; and
producing a second semiconductor device which includes a second substrate having a second rectangular-shape with a second width equal to said first width, a second length less than twice said first length and a median line extending in a direction of said second width;
wherein said second substrate includes first and second semiconductor circuit mounting locations on opposite sides of said median line with electrically-conductive formations providing a second pattern of electrical interface nodes; and
wherein said second pattern of electrical interface nodes comprises:
said two unmorphed replicas of said first pattern of electrical interface nodes arranged mutually rotated 180° on opposite sides of said median line; and
said two second sets of electrical interface nodes located between the first and second semiconductor circuit mounting locations and arranged mutually rotated 180° on opposite sides of said median line.

13. The method of claim 12:
wherein designing the first semiconductor device comprises designing said first set of electrical interface nodes at said fourth side of said first substrate to comprise a proximal region of electrical interface nodes and a distal region of electrical interface nodes; and wherein morphing said first set of electrical interface nodes comprises merging said proximal region of electrical interface nodes and said distal region of electrical interface nodes.

\* \* \* \* \*